United States Patent
Gangemi et al.

(10) Patent No.: US 12,477,698 B1
(45) Date of Patent: Nov. 18, 2025

(54) HIGH VOLUME, LOW PRESSURE EXHAUST SYSTEM

(71) Applicant: Amazon Technologies, Inc., Seattle, WA (US)

(72) Inventors: Matthew Gangemi, Seattle, WA (US); Ian Brewe, Beverly Shores, IN (US)

(73) Assignee: Amazon Technologies, Inc., Seattle, WA (US)

( * ) Notice: Subject to any disclaimer, the term of this patent is extended or adjusted under 35 U.S.C. 154(b) by 350 days.

(21) Appl. No.: 18/332,545

(22) Filed: Jun. 9, 2023

(51) Int. Cl.
| | |
|---|---|
| *H05K 7/20* | (2006.01) |
| *F24F 7/02* | (2006.01) |
| *F24F 13/14* | (2006.01) |
| *F24F 110/40* | (2018.01) |

(52) U.S. Cl.
CPC ......... *H05K 7/20745* (2013.01); *F24F 7/025* (2013.01); *F24F 13/1413* (2013.01); *F24F 2110/40* (2018.01)

(58) Field of Classification Search
CPC .. H05K 5/0212; H05K 5/0213; H05K 5/0214; H05K 7/20745; H05K 7/20009; H05K 7/20145
See application file for complete search history.

(56) References Cited

U.S. PATENT DOCUMENTS

| | | | | |
|---|---|---|---|---|
| 4,447,856 A | * | 5/1984 | Takahashi | .......... H05K 7/20009 |
| | | | | 361/802 |
| 10,104,804 B2 | * | 10/2018 | Sasaki | .................. H05K 5/0212 |

OTHER PUBLICATIONS

Greenheck, "Tube Axial Roof Upblast—Model TAUB with Fabricated Steel Propeller", Copyright © 2023 Greenheck Fan Corp., Apr. 1, 2023, pp. 1-8.

* cited by examiner

*Primary Examiner* — Allen R. B. Schult
(74) *Attorney, Agent, or Firm* — Alexander A. Knapp; Kowert, Hood, Munyon, Rankin & Goetzel, P.C.

(57) ABSTRACT

An exhaust system that utilizes high volume, low speed (HVLS) fans for exhausting air from data storage facilities (e.g., data centers) is disclosed. The exhaust system includes modular exhaust devices that may be positioned on curb structures on a roof of the facility. The modular exhaust devices are positioned vertically above the HVLS fans with openings in the roof vertically between the fans and the devices. The modular exhaust devices include a v-shaped conduit to direct air to openings on either side of the v-shaped conduit. Butterfly dampers may be placed on the openings in the modular exhaust devices to inhibit rain from entering the facility when the fans are off or at low speeds that don't prevent rain from entering the facility.

20 Claims, 6 Drawing Sheets

HIGH VOLUME, LOW PRESSURE EXHAUST SYSTEM

BACKGROUND

Advancements in cloud-based computing has given rise to increased utilization of data centers. Data centers are physical locations that have large amounts of computing infrastructure to provide cloud-based computing services to one or more customers (e.g., end users). Data centers may include computing infrastructure such as servers, data storage drives, network equipment, and power equipment. As the use of cloud-based computing increases, data centers are increasing in size and/or density (e.g., infrastructure density). An important component of maintaining reliable operation of data centers is temperature control. As is known, computing infrastructure has longer lifetimes and more reliability at cooler temperatures. Thus, having temperature-controlled facilities is important to extend the lifetime and improve the reliability of the computing infrastructure. With increases in size and/or density of computing infrastructure in data centers, dissipation of heat (e.g., cooling) becomes more difficult. Air movement within and out of data center facilities (e.g., buildings) is an important component in providing sufficient temperature-control for the data center computing infrastructure. Without air movement, heat is not easily dissipated and can build-up and cause failures or reduce lifetimes of the computing infrastructure.

Figure 1:
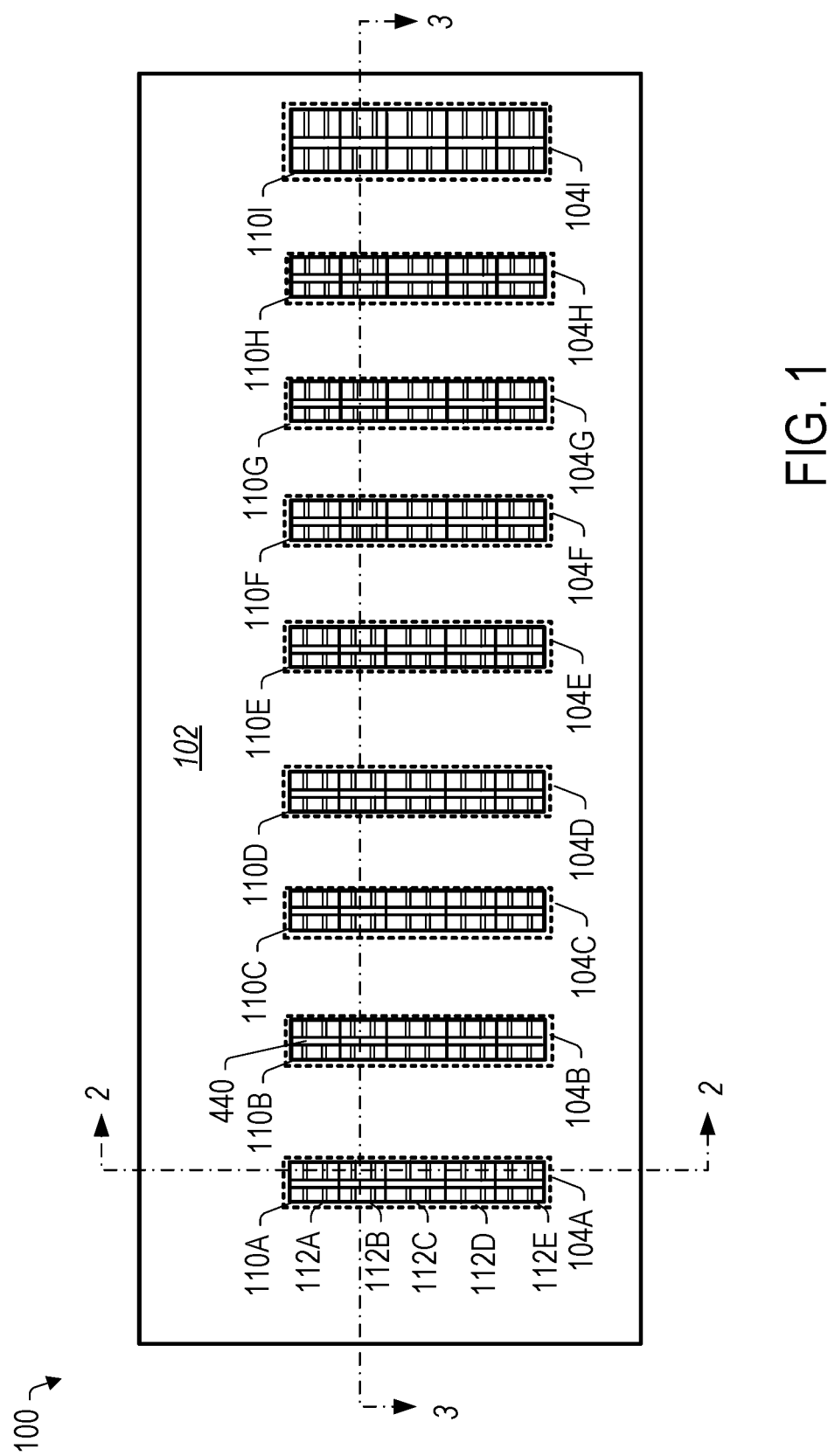
FIG. 1 depicts a top plan view representation of a data storage facility with an exhaust system, according to some embodiments.

While embodiments are described herein by way of example for several embodiments and illustrative drawings, those skilled in the art will recognize that the embodiments are not limited to the embodiments or drawings described. It should be understood that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicate open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

The present disclosure relates to apparatus and methods for providing air movement for cooling in large data storage facilities (e.g., data centers). Data storage facilities include different types of equipment that produce noise. For example, power generators, air handlers, exhaust fans, and server racks may be major contributors to noise generation in data storage facilities. The disclosed embodiments are capable of moving large volumes of air at low pressures with low sound generation. Additionally, the reduction in sound generation for the data storage facilities is implemented without impacting power consumption (e.g., reducing power consumption) or data storage capabilities (e.g., reducing data storage amounts) in the data storage facilities.

FIG. 1 depicts a top plan view representation of a data storage facility with an exhaust system, according to some embodiments. In various embodiments, data storage facility 100 is a data center that stores computing machines and related hardware equipment. For instance, data storage facility 100 may include computing infrastructure such as servers, data storage drives, and network equipment along with supporting infrastructure such as power equipment and other service equipment. In some embodiments, the data center may be implemented to provide cloud computing services for one or more customers.

In various embodiments, data storage facility 100 includes a plurality of exhaust systems 110 positioned on roof 102 of the data storage facility. In the illustrated embodiment, data storage facility 100 has nine exhaust systems 110A-110I though any number of exhaust device systems may be implemented as needed or required based on the operating requirements or design of data storage facility 100. Further in various embodiments, each exhaust system 110 includes a plurality of exhaust device modules 112. For instance, in the illustrated embodiment, each exhaust system 110 includes five exhaust device modules 112A-112E. Again, the number of exhaust device modules 112 may vary based on the operating requirements or design for data storage facility 100. Exhaust systems 110A-I, as described herein, are positioned on roof 102 to move air at high volumes and low pressures out of data storage facility 100 through corresponding openings 104A-I in the roof.

Figure 2:
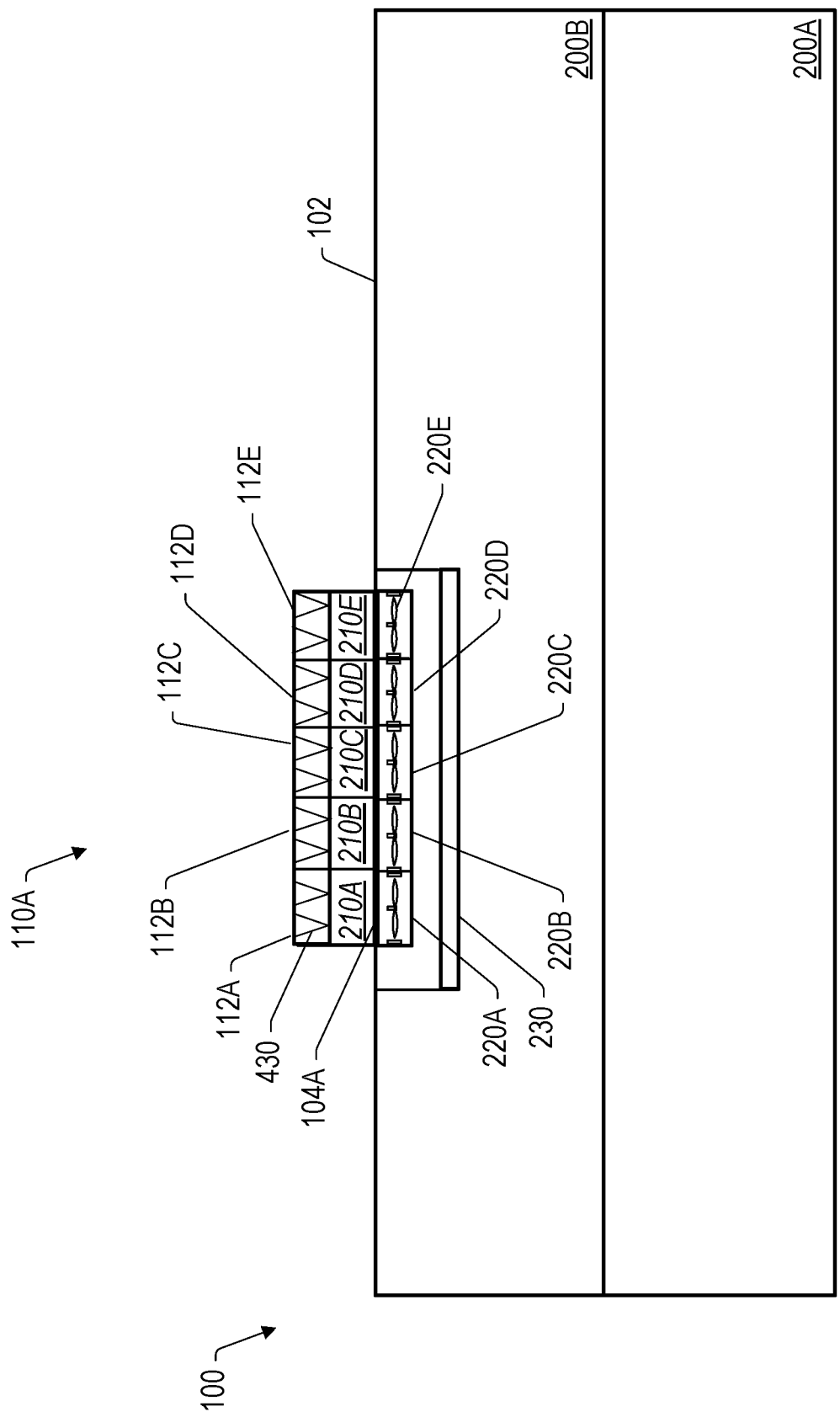
FIG. 2 depicts a cross-section representation of a data storage facility with exhaust systems along the line 2-2 in FIG. 1, according to some embodiments.
Figure 3:
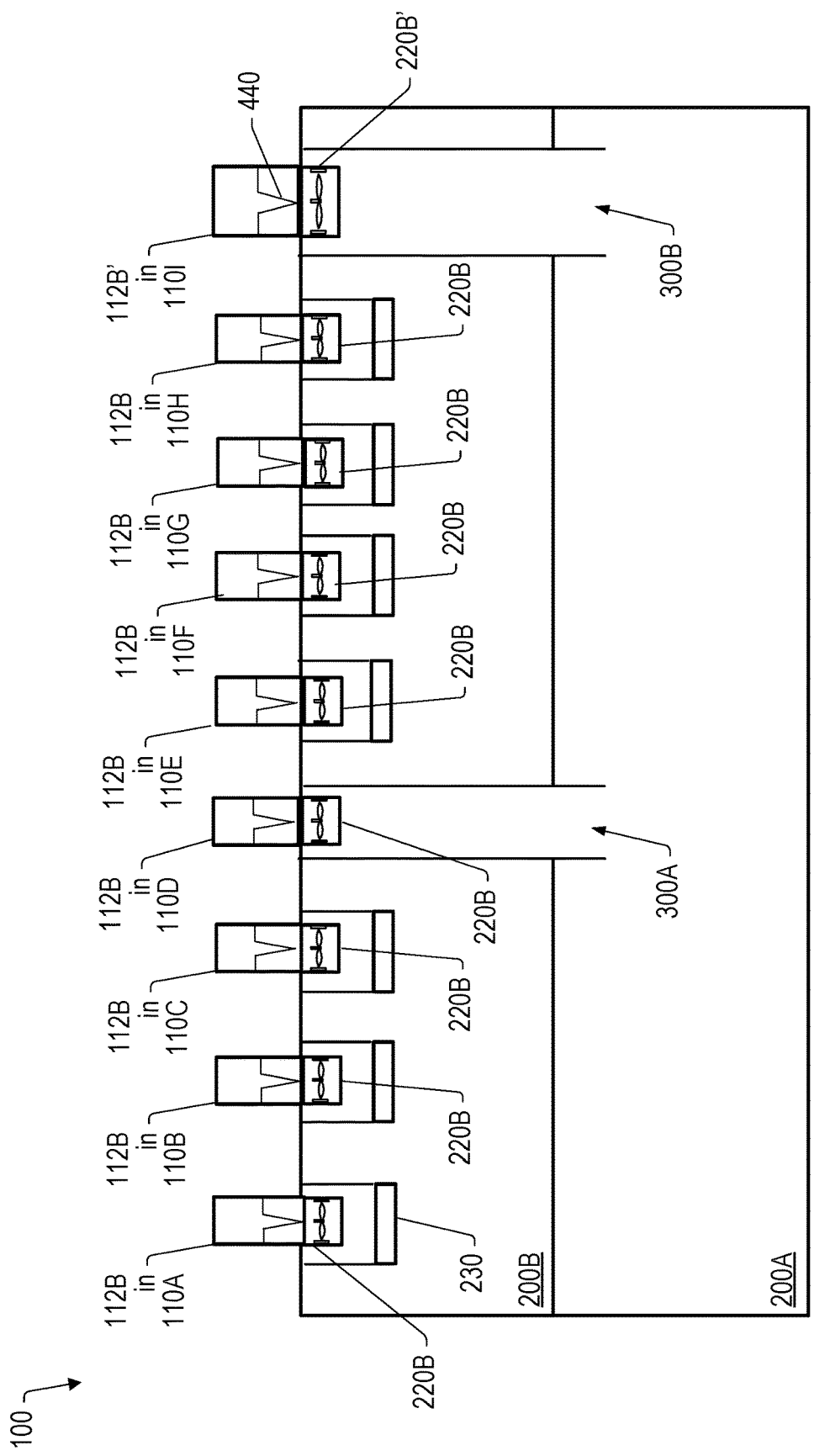
FIG. 3 depicts a cross-section representation of a data storage facility with exhaust systems along the line 3-3 in FIG. 1, according to some embodiments.

FIG. 2 depicts a cross-section representation of data storage facility with exhaust systems 110 along the line 2-2 in FIG. 1, according to some embodiments. FIG. 3 depicts a cross-section representation of data storage facility with exhaust systems 110 along the line 3-3 in FIG. 1, according to some embodiments. In the illustrated embodiment, data storage facility 100 is a two-floor data storage facility with first floor 100A and second floor 100B. Data storage facility 100 may, however, have only one floor or more than two floors. Additionally, data storage facility 100 may include various sub-floors or other compartmentalization implemented as part of an architectural and/or engineering design of the data storage facility.

Turning to FIG. 2, the depicted cross-sectional representation includes exhaust system 110A with five exhaust device modules 112A, 112B, 112C, 112D, and 112E on roof 102 above opening 104A. In certain embodiments, exhaust device modules 112A-E of exhaust system 110A are positioned on respective roof structures 210A-E over opening 104A. In some embodiments, opening 104A is a collection of individual openings in roof 102 with roof structures 210A-E positioned around each individual opening. In other embodiments, opening 104A may be a single opening on roof 102 with roof structures 210A-E subdividing the opening into individual openings. Structures 210A-E may be rectangular support structures installed on roof 102 as part of the construction of the roof to provide support and guide positioning of other structures around opening 104A. For example, structures 210A-E may be curb structures installed as part of the construction of roof 102. Curb structures (e.g., roof structures 210) may be structures with four vertical sidewalls surrounding the opening in roof 102. The curb structures (e.g., roof structures 210A-E) then provide guidance for positioning of exhaust device modules 112A-E while also providing mechanical support for the exhaust device modules on roof 102. Further details on an individual exhaust device module 112 and roof structure 210 are shown and described with respect to FIGS. 4-6 below.

In various embodiments, as shown in FIG. 2, exhaust fans 220A-E are positioned below each respective exhaust device module 112A-E. Exhaust fans 220 may, for example, be coupled or attached to an underside of roof 102. For instance, exhaust fans 220 may be coupled to a sub-roof structure of roof 102. In certain embodiments, exhaust fans 220 are high volume, low speed (HVLS) exhaust fans. Such HVLS fans are capable of moving high volumes of air at low speeds with low noise generation due to the large fan blade lengths and diameters of the fans. For example, HVLS fans may have diameters between 8 feet and 32 feet. In one contemplated embodiment, fans 220 have a diameter of about 12 feet. In various embodiments, the blades of fans 220 are made of extruded aluminum though other materials may be contemplated. The blades may also, in some contemplated embodiments, have curves or other design features that provide acoustic benefits (e.g., reduce noise) or energy benefits (e.g., increase fan energy efficiency).

In certain embodiments, fans 220A-E are installed directly below exhaust device modules 112A-E to provide an updraft of air from data storage facility 100 out through exhaust systems 110. Thus, each fan 220 provides an updraft or outflow of air vertically through its respective exhaust device module 112 (e.g., fan 220A provides a vertical updraft of air through exhaust device module 112A). Providing a direct vertical airflow from fans 220 to exhaust device modules 112 allows movement of high volumes of air at low pressures. With the arrangement of fans 220 below exhaust device modules 112, the fans may operate to pull air away from equipment in data storage facility 100 (e.g., server racks or power equipment) and move the air out through the exhaust device modules.

In some embodiments, fans 220 are variable speed fans. The speed of fans 220 may be controlled, for example, based on a pressure measured below the fans (such as a space near or directly above server racks). Fans 220 may be designed to exhaust air that has been pushed into data storage facility 100 by air handling devices. For instance, fans 220 are designed to relieve pressure (and balance pressure) generated in data storage facility by the air being moved in by the air handling devices. Accordingly, the speed of fans 220 may be varied based on a pressure measured in a space below the fans (e.g., a hot plenum feed below the fans). When the measured pressure increases, the speed of fans 220 may be increased to relieve the pressure from the space below the fans. Conversely, fans 220 may be operated at lower speeds as the pressure in the space below the fans drops. Speed of fans 220 may be controlled by a variable frequency drive (VFD) controller or other controller that can change the voltage provided to the fan to control the speed of the fan. In some embodiments, a maximum speed (e.g., speed limit) may be set for fans 220. The maximum speed may be, for example, a speed to avoid having the fans operate at that may bend the fan blades.

In certain embodiments, openings 104 have sizes that correspond to the size of fans 220 and exhaust device modules 112. For instance, openings 104 may have an outer diameter substantially similar to a diameter that blades of fan 220 extend (e.g., opening 104 is about 12 feet for a fan with blades extending to 12 feet). Further, the corresponding exhaust device module may have outer dimensions corresponding to the 12 foot fan diameter. The correspondence in sizes between openings 104, fans 220, and exhaust device module 112 allows air to move through the exhaust system at lower pressures since air does not have be forced out smaller holes. In various embodiments, the size of fans 220, openings 104, and exhaust device modules 112 are designed to provide a specified pressure drop across the fans.

The direct design of having fans 220 directly beneath openings 104 and exhaust device modules 112 allows low pressure drops to be maintained in exhaust systems 110. For instance, in certain embodiments, fans 220 operate at a pressure drop of between about 0.05 inches of water column and about 0.2 inches of water column. For instance, fans 220 may operate at a pressure drop of at most about 0.2 inches of water column. Operating at these pressure drops allows fans 220 to operate at noise levels below a maximum desired noise level. For example, fans 220 may operate at noise levels of at most 40 dBA, at most 45 dBA, or at most 50 dBA. The low pressure and low noise operation allows fans 220 (and the corresponding exhaust devices) to reduce sound in data storage facility 100 compared to previous exhaust systems without impacting power consumption and data capabilities of data storage facility 100.

As shown in FIGS. 2 and 3, fans 220 are placed below exhaust device modules 112 to exhaust air from data storage facility 100 as an updraft of airflow through the exhaust device modules. When fans 220 are operational, the velocity of airflow up from the fans may be sufficient to prevent rain or other water droplets from entering data storage facility 100 through the fans. At certain times, however, fans 220 may not be operating or operating with such low velocity that rain/water droplets may potentially enter data storage facility 100 through the fans. Accordingly, in certain embodiments, exhaust device modules 112 include components to prevent water from entering data storage facility 100 when the velocity of fans 220 is not sufficient to prevent water from entering through the fans.

Figure 4:
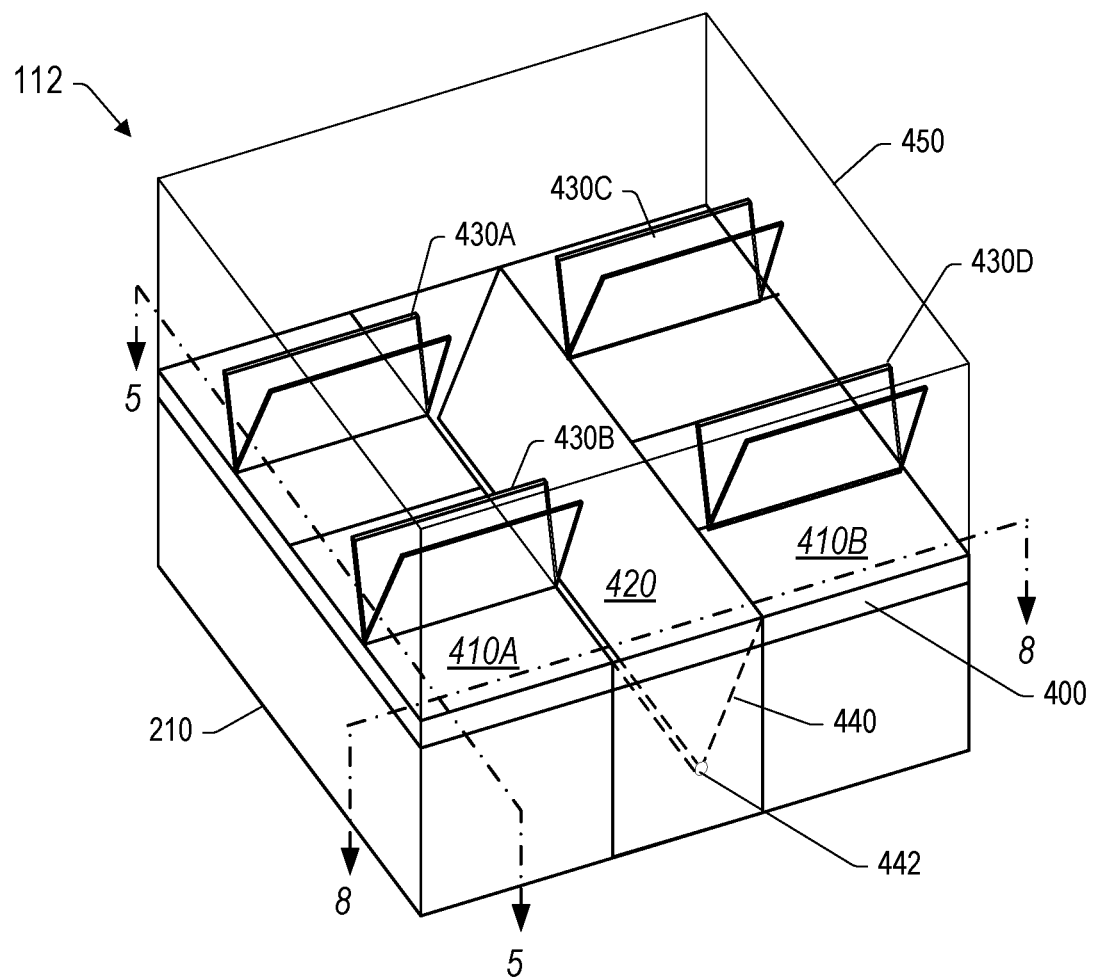
FIG. 4 depicts a perspective view representation of an exhaust device module positioned on a roof structure, according to some embodiments.

FIG. 4 depicts a perspective view representation of exhaust device module 112 positioned on roof structure 210, according to some embodiments. In the illustrated embodiment, exhaust device module 112 includes rectangular structure 400. Rectangular structure 400 may be, for example, a rectangular support structure or other support base that is positioned on roof structure 210. In certain embodiments, rectangular structure 400 includes outside portions 410A, 410B and middle portion 420. Outside portions 410A, 410B may be rectangular substructures of rectangular structure 400 with middle portion 420 positioned between the substructures.

In certain embodiments, rectangular structure 400 has a width and length to accommodate the size of opening 104 and diameter of fan 220. For example, rectangular structure 400 may have a width that is at least 8 feet and a length that is at least 8 feet to accommodate a fan with blades extending 8 feet and its corresponding opening 104 being 8 feet. Rectangular structure 400 may then be larger as fan 220 is larger in size. In various embodiments, exhaust device module 112 includes wind band 450. Wind band 450 may be a wind protection band positioned around dampers 430 to protect the dampers from external wind (e.g., to prevent external wind from closing dampers or making the dampers flap or flutter). In some embodiments, acoustical mitigation may be implemented in wind band 450. For example, internal walls of wind band 450 may be lined with one or more layers of material that provides acoustic mitigation (such as acoustic insulation material). In various embodiments, the layers of acoustically insulating material may be perforated to allow some wind passage through the layers.

In certain embodiments, exhaust device module 112 includes dampers 430 positioned on the upper surfaces of outside portions 410A, 410B. Note that examples of dampers 430 are also shown in the cross-sectional representation of FIG. 2. In one contemplated embodiment, as shown in FIG. 4, two dampers 430 are positioned on each of outside portions 410A, 410B. For instance, in the illustrated embodiment, dampers 430A, 430B are positioned on outside portion 410A and dampers 430C, 430D are positioned on outside portion 410B. Dampers 430 may be, for example, butterfly-shaped dampers that are implemented in exhaust device module 112 to provide weather protection for fan 220 and data storage facility 100 below the fan. Two dampers 430 (and two corresponding openings 510, described below) may be implemented to provide damper coverage over the large area of opening 104 associated with exhaust device module 112. While some embodiments may be contemplated that implement a single, large damper on an outside portion of exhaust device module 112, such a single damper might require very lightweight damper panels in order to operate properly with the air flows provided by fan 220. Utilization of two dampers, however, allows for more flexibility in materials used for the dampers (e.g., aluminum or other corrosion resistant materials) while providing desired operation with air flow through opening 104 provided by fan 220.

Figure 5:
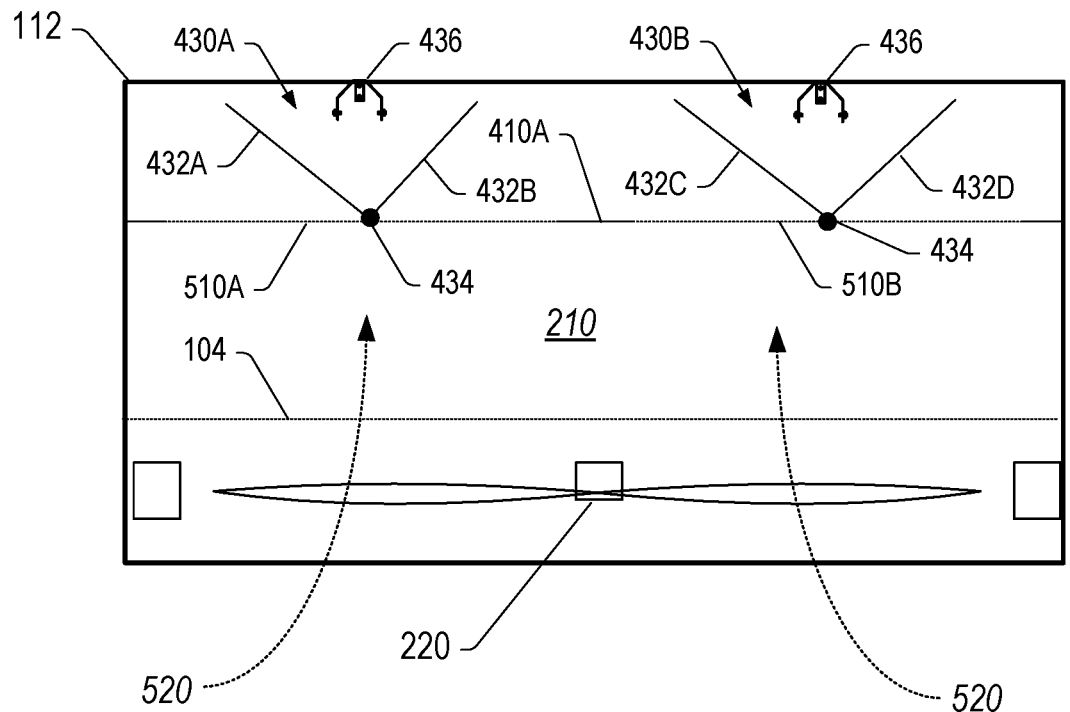
FIG. 5 depicts a cross-sectional representation of an exhaust device module with the cross-section along line 5-5 in FIG. 4, according to some embodiments.

FIG. 5 depicts a cross-sectional representation of exhaust device module 112 with the cross-section through outside portion 410A along line 5-5 in FIG. 4, according to some embodiments. Fan 220 and opening 104 are included in the cross-sectional representation of FIG. 5 to provide better understanding of the operation of exhaust device module 112. The cross-section of FIG. 5 passes through dampers 430A, 430B positioned on outside portion 410A. In certain embodiments, damper 430A is positioned above opening 510A in outside portion 410A and damper 430B is positioned above opening 510B in outside portion 410A. Opening 510 may be, for example, rectangular cross-section openings through outside portion 410A. As shown by arrows 520, airflow generated by fan 220 causes air to updraft through openings 510A, 510B. Thus, when fan 220 is turned on, as described above, the updraft created by the fan prevents rain/water from flowing downwards through exhaust device module 112 and the fan. Dampers 430A, 430B are provided to provide weather protection to fan 220 and data storage facility 100 when the speed of air from fan 220 is not sufficient to prevent rain/water from flowing downwards.

In certain embodiments, as shown in FIG. 5, damper 430A includes panels 432A, 432B and damper 430B includes panels 432C, 432D. Panels 432 may be, for example, rectangular panels (e.g., rectangular flaps) made of aluminum or another lightweight, non-corrosive material. Each pair of panels 432 may be pivotably coupled along their lower edges to form a "butterfly-shape" for the damper 430. For instance, damper 430A is formed by coupling, at coupling 434, the lower edge of panel 432A to the lower edge of panel 432B lengthwise along the lower edges (e.g., along an axis that goes into the page of the drawing from coupling 434). Thus, each of panel 432A and panel 432B is allowed to pivot about coupling 434. Coupling 434 and its pivoting mechanism may be implemented through various techniques known in the art. For example, coupling 434 may be a butt-hinge bracket used to couple the lower edge of panel 432A to panel 432B.

Figure 6:
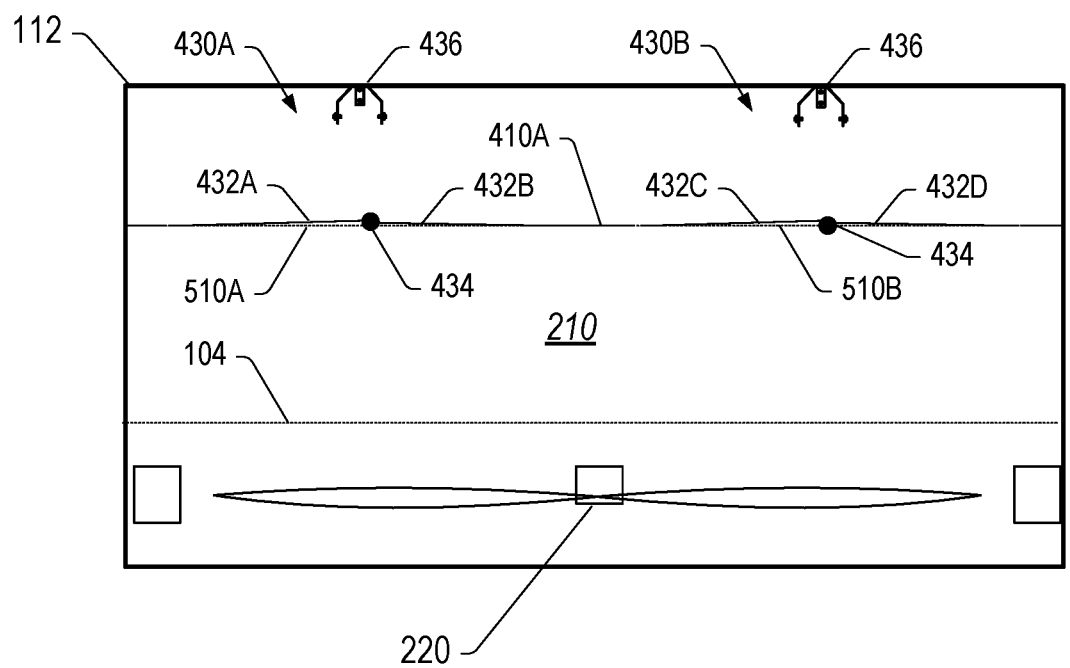
FIG. 6 depicts a cross-sectional representation of an exhaust device module with dampers closed, according to some embodiments.

In certain embodiments, dampers 430 are gravity-loaded dampers. For instance, panels 432 move up/down based on the weight of the panels versus the updraft airflow through openings 510 (e.g., the updraft airflow provided by fan 220). Thus, a default position of panels 432 without any airflow is all the way down (e.g., the panels lay flat on outside portion 410 close off openings 510A, 510B). FIG. 6 depicts a cross-sectional representation of exhaust device module 112 with dampers 430 closed, according to some embodiments. In this closed position, panels 432A-D prevent rain/water from entering openings 510A, 510B and passing to fan 220 or data storage facility 100 below the fan.

When airflow is provided by fan 220, the force of the airflow (e.g., arrows 520) pivots panels 432 upward about coupling 434. In the illustrated embodiment of FIG. 5, panels 432A-D are pivoted partially upward (e.g., the panels are not fully open). In the partially upward position (e.g., partially open position), panels 432 have a characteristic butterfly shape such that dampers 430 may be referenced as "butterfly dampers". In the partially open position (which may also be referred to as a partially closed position), any water that may enter exhaust device module 112 is prevented from entering fan 220 by the speed of the air updraft from the fan or by panels 132. Any rain trapped by panels 132 enters the area between the panels (e.g., the inside of the "v" of the panels). Water in this area between panels 132 may be drained towards outer walls of the rectangular structure 400 and the underlying roof structure 210. For instance, as shown in FIG. 4, dampers 430 may be slightly tilted downwards towards the outer edges (e.g., walls) of rectangular structure 400 such that any water in the "v" of dampers 430 drains outwards and outside the sidewalls of roof structure 210. In certain embodiments, exhaust device module 112 includes a gap between the ends of dampers 430 and wind band 450 to allow water to drain out of the dampers.

Figure 7:
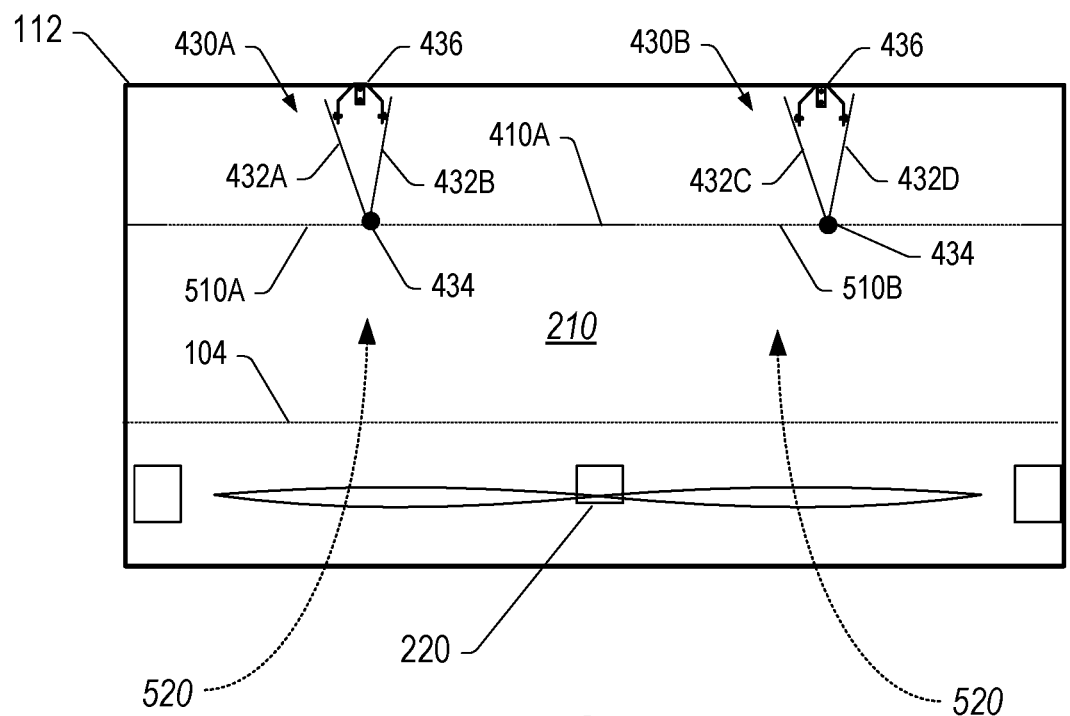
FIG. 7 depicts a cross-sectional representation of an exhaust device module with dampers fully open, according to some embodiments.

FIG. 7 depicts a cross-sectional representation of exhaust device module 112 with dampers 430 fully open, according to some embodiments. In this fully open position, panels 432A-D are almost vertical and only the airflow from fan 220 prevents water from entering the fan and data storage facility 100 below the fan (though some water may still enter the "v" between the panels). In some embodiments, exhaust device module 112 includes panel stops 436. Panel stops 436 may provide a stop for panels 432 when fully open that prevents the panels from going fully vertical. Stopping panels 432 from being fully vertical maintains at least some downward gravity force on the panels to prevent the panels from getting stuck in a vertical position.

Some embodiments may be contemplated where dampers 430 include counterbalance weights coupled to panels 432. Counterbalance weights may be implemented, for example, when backpressure on panels 432 cannot be overcome by the speed of airflow generated by fan 220. Additional embodiments may also be contemplated where exhaust device modules 112 are implemented without fans. In such embodiments, airflow out of the exhaust device modules 112 has little to no pressure and counterbalance weights may be needed to provide sufficient force to open the panels and the dampers. The counterbalance weights may be adjustable weights or designed as fixed weights once a required weight for the counterbalance is determined.

Turning back to FIG. 4, in various embodiments, as described above, exhaust device module 112 includes middle portion 420 between outside portion 410A and outside portion 420A. Exhaust device module 112 may include middle portion 420 to provide a space between dampers 430. Providing a gap between dampers allows exhaust device module 112 to be modular and part of an array of exhaust device modules, as shown in FIGS. 1-3.

Figure 8:
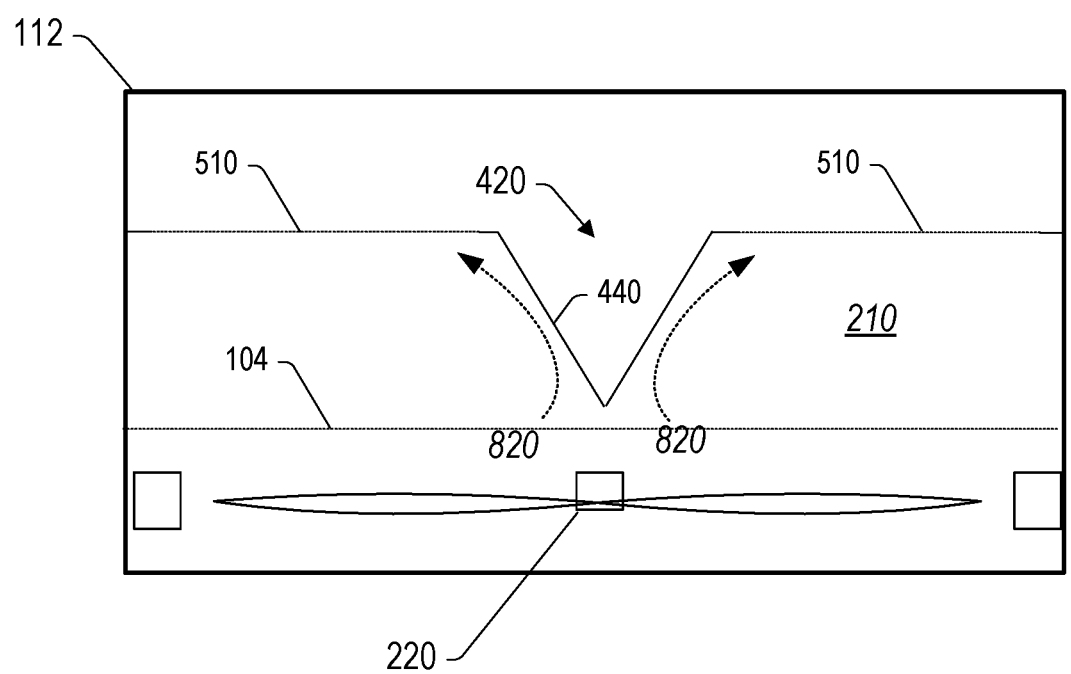
FIG. 8 depicts a cross-sectional representation of an exhaust device module with the cross-section along line 8-8 in FIG. 4, according to some embodiments.

FIG. 8 depicts a cross-sectional representation of exhaust device module 112 with the cross-section along line 8-8 in FIG. 4, according to some embodiments. The cross-section of FIG. 8 passes through middle portion 420. In certain embodiments, as shown in FIGS. 4 and 8, middle portion 420 includes v-shaped conduit 440. V-shaped conduit 440 is a conduit that extends vertically downwards from rectangular structure 400. For example, v-shaped conduit 440 extends downwards from rectangular structure 400 towards opening 104, as shown in FIG. 8. In certain embodiments, v-shaped conduit 440 extends below the upper surface (e.g., upper plane) of roof structure 210.

V-shaped conduit 440, as shown in FIG. 4, is a conduit that runs perpendicular to the lengthwise direction of panels 432 in dampers 430. Thus, the "v" of v-shaped conduit 440 is perpendicular to the "v" of dampers 430. Turning to FIG. 8, v-shaped conduit 440 has sides that are oriented at an angle of about 30 degrees from vertical. This angle may, however, vary. With v-shaped conduit 440 positioned at or near a center of fan 220, the angle of the sides of v-shaped conduit 440 directs airflow entering exhaust device module 112 towards openings 510 (e.g., the openings in outside portions 410) as shown by arrows 820. This direction of the airflow by v-shaped conduit 440 allows air to get directed to dampers 430 without a large pressure drop that may affect the operation of panels 432 or fan 220.

Additionally, the shape of v-shaped conduit 440 allows any rain/water from above to enter the conduit and get directed away from dampers 430. In various embodiments, water that enters v-shaped conduit 440 may get drained out through the sidewalls of roof structure 210 via conduit 442, shown in FIG. 4. Conduit 442 may be, for example, a pipe or other drain structure formed through the sidewall of roof structure 210 after installation of exhaust device module 112.

In various embodiments, the structure of v-shaped conduit 440 and its path across exhaust device module 112 perpendicular to dampers 430 allows for placement of multiple exhaust device modules 112 in an array of modules. For example, turning back to FIG. 1, v-shaped conduit 440 is indicated in the depiction of exhaust system 110B. As shown in the depiction, conduit 440 runs the length of all five exhaust device modules 112A-E in exhaust system 110B (e.g., conduit 440 runs perpendicular from the top to the bottom of exhaust system 110B in the illustration of FIG. 1). Thus, having v-shaped conduit 440 in exhaust device module 112 allows a continuous drain path to be implemented when multiple exhaust device modules are positioned adjacent in an exhaust system such as exhaust system 110B. In such an arrangement, openings may be formed between adjacent v-shaped conduits to form the continuous drain path.

In some embodiments, as shown in FIGS. 2 and 3, drip pans 230 are positioned below fans 220. Drip pans 230 may include a single drip pan below multiple fans or each fan may have its own drip pan. For example, as shown in FIG. 2, drip pan 230 is a single drip pan positioned below fans 220A-220E. Turning to FIG. 3, drip pans 230 are single drip pans positioned below fans 220B.

Various embodiments may be contemplated where different exhaust systems and/or different exhaust device modules are connected to different floors in data storage facility. For instance, as shown in FIG. 3, exhaust device module 112B in exhaust system 110D is connected to first floor 200A by chimney 300A and exhaust device module 112B in exhaust system 110I is connected to first floor 200A by chimney 300B. The rest of exhaust device modules 112B in exhaust systems 110A-C and 110E-H are connected directly to second floor 200B.

In some embodiments, one or more of the exhaust systems connected to lower floors may have a larger size to accommodate differences in pressure associated with moving air from the lower floor. For example, as shown in FIG. 3, chimney 300B has a larger size than chimney 300A. A larger diameter fan 220B' and a larger corresponding exhaust device module 112B' in exhaust system 110I may be implemented to accommodate the larger size of chimney 300B in order to move higher volumes of air associated with the larger chimney size while maintaining a low pressure drop across fan 220B'.

The various methods as illustrated in the figures and described herein represent illustrative embodiments of methods. The methods may be implemented manually, in software, in hardware, or in a combination thereof. The order of any method may be changed, and various elements may be added, reordered, combined, omitted, modified, etc. For example, in one embodiment, the methods may be implemented by a computer system that includes a processor executing program instructions stored on a computer-readable storage medium coupled to the processor. The program instructions may be configured to implement the functionality described herein.

Various modifications and changes may be made as would be obvious to a person skilled in the art having the benefit of this disclosure. It is intended to embrace all such modifications and changes and, accordingly, the above description to be regarded in an illustrative rather than a restrictive sense.

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly, the above description to be regarded in an illustrative rather than a restrictive sense.

What is claimed is:

1. An exhaust system for a data center, comprising:
 a rectangular support structure attached to an opening in a roof of a data center, wherein the rectangular support structure includes four vertical sidewalls surrounding an opening substantially similar in size to the opening in the roof;
 a modular exhaust device, wherein the modular exhaust device includes:
  first and second rectangular substructures, each substructure having two rectangular cross-section openings vertically through the substructure; and
  a v-shaped conduit positioned between the first and second rectangular substructures, wherein the v-shaped conduit is positioned vertically below an upper surface of the rectangular support structure;
  wherein the rectangular substructures and the v-shaped conduit extend from a first sidewall of the rectangular support structure to a second sidewall of the rectangular support structure opposite the first sidewall, wherein the v-shaped conduit is positioned at or near a middle portion between a third sidewall and a fourth sidewall of the rectangular support structure, the third and fourth sidewalls being orthogonal to the first and second sidewalls;
 a first pair of butterfly dampers coupled to the first rectangular substructure, each damper being positioned above one of the rectangular cross-section openings; and
 a second pair of butterfly dampers coupled to the second rectangular substructure, each damper being positioned above one of the rectangular cross-section openings;
 wherein the butterfly dampers include:
  a first rectangular panel; and
  a second rectangular panel;
  wherein a lower edge of the second panel is pivotably coupled to a lower edge of the first panel lengthwise along the lower edges, the lower edges being coupled to the rectangular substructures, wherein the lower edges are oriented parallel to the third and fourth sides of the rectangular support structure, and wherein the lower edges are positioned lengthwise across a middle portion of the rectangular cross-section openings in the rectangular substructures such that the panels are capable of pivoting up and down relative to the lower edges based on a pressure of airflow outwards through the rectangular cross-section openings; and
 drain conduits placed through the first and second sidewalls of the rectangular support structure at each end of the v-shaped conduit.

2. The exhaust system of claim 1, further comprising a high volume, low speed fan coupled to the opening in the roof of the data center.

3. The exhaust system of claim 2, wherein the fan is positioned inside the data center vertically below the rectangular support structure, and wherein blades of the fan extend to an outer diameter substantially similar to a diameter of the opening in the roof.

4. The exhaust system of claim 1, wherein a pivot angle of the panels is determined based on the pressure of airflow outwards through the rectangular cross-section openings versus a weight of the panels.

5. The exhaust system of claim 1, wherein walls of the v-shaped conduit are oriented at an angle of about 30 degrees from vertical to direct airflow through the rectangular cross-section openings in the rectangular substructures.

6. An exhaust device for a computer data storage facility, comprising:
 a rectangular structure configured to be placed on a curb structure positioned over an opening in a roof of a computer data storage facility, wherein the rectangular structure includes a pair of outside portions separated by a middle portion, wherein the middle portion includes:
  a v-shaped conduit extending vertically below a lower surface of the outside portions of the rectangular structure;
 wherein the outside portions include:
  at least one butterfly damper coupled to an upper surface of each of the outside portions of the rectangular structure, each damper being positioned above a rectangular cross-section opening in the outside portions; and
 wherein the butterfly dampers include:
  a pair of rectangular panels pivotably coupled along their lower edges and to the upper surface of the outside portions of the rectangular structure, wherein the rectangular panels are oriented perpendicular to the v-shaped conduit.

7. The exhaust device of claim 6, wherein the exhaust device is configured to be positioned over the opening in the roof and above a high volume, low speed fan coupled to the opening in the roof of the computer data storage facility.

8. The exhaust device of claim 7, wherein the exhaust device is configured to be positioned vertically above the fan.

9. The exhaust device of claim 6, wherein the rectangular structure has a width and a length of at least 8 feet.

10. The exhaust device of claim 6, wherein the rectangular panels are capable of pivoting up and down relative to the lower edges based on a pressure of airflow outwards through the rectangular cross-section openings in the outside portions.

11. The exhaust device of claim 10, wherein a pivot angle of the rectangular panels is determined based on the pressure of airflow outwards through the rectangular cross-section openings versus a weight of the rectangular panels.

12. The exhaust device of claim 6, wherein the pair of rectangular panels are pivotably coupled lengthwise along their lower edges.

13. The exhaust device of claim 6, further comprising a wind protection band coupled to the rectangular structure and positioned around the butterfly dampers.

14. The exhaust device of claim 13, wherein a gap exists between the wind protection band and the butterfly dampers to allow fluid drainage through the gap.

15. The exhaust device of claim 13, further comprising coupling one or more layers of acoustic insulation to inner walls of the wind protection band.

16. The exhaust device of claim 6, wherein the v-shaped conduit includes drain conduits at ends of the v-shaped conduit, the drain conduits being configured to extend through sidewalls of the curb structure when the rectangular structure is placed in position on the curb structure.

17. An exhaust system for a computer data storage facility, comprising:
- a plurality of curb structures attached to an opening in a roof of a computer data storage facility, wherein the curb structures include four vertical sidewalls surrounding openings substantially similar in size to the openings in the roof;
- a plurality of rectangular structures configured to be placed on the curb structures, wherein the rectangular structures include pairs of outside portions separated by middle portions, wherein at least one middle portion includes:
  - a v-shaped conduit extending vertically below a lower surface of the outside portions of the rectangular structure;
- wherein the outside portions corresponding to the at least one middle portion include:
  - a pair of butterfly-shaped dampers coupled to an upper surface of the outside portions of the rectangular structure, each damper being positioned above a rectangular cross-section opening in the outside portions; and
- wherein the butterfly-shaped dampers include:
  - a pair of rectangular panels pivotably coupled along their lower edges and to the upper surface of the outside portions of the rectangular structure, wherein the rectangular panels are oriented perpendicular to the v-shaped conduit.

18. The exhaust system of claim 17, wherein the curb structures and the rectangular structures are aligned in parallel along a first axis on the roof of the data storage facility.

19. The exhaust system of claim 18, wherein the v-shaped conduits are aligned adjacently along the first axis to form a continuous drain path from a first of the v-shaped conduits to a last of the v-shaped conduits in the plurality of rectangular structures.

20. The exhaust system of claim 17, further comprising a plurality of high volume, low speed fans coupled to the openings in the roof of the computer data storage facility, one fan being coupled to each opening.

* * * * *